US007153630B2

(12) United States Patent
Fedynyshyn

(10) Patent No.: US 7,153,630 B2
(45) Date of Patent: Dec. 26, 2006

(54) RESIST WITH REDUCED LINE EDGE ROUGHNESS

(75) Inventor: Theodore H. Fedynyshyn, Sudbury, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 52 days.

(21) Appl. No.: 11/146,597

(22) Filed: Jun. 7, 2005

(65) Prior Publication Data

US 2006/0078820 A1    Apr. 13, 2006

Related U.S. Application Data

(63) Continuation of application No. 09/851,952, filed on May 9, 2001, now Pat. No. 6,936,398.

(51) Int. Cl.
*G03F 7/004* (2006.01)
(52) U.S. Cl. .............................. 430/270.1; 430/286.1; 526/242
(58) Field of Classification Search ............. 430/270.1, 430/281.1, 286.1
See application file for complete search history.

(56) References Cited

U.S. PATENT DOCUMENTS

| 3,148,983 | A | 9/1964 | Endermann et al. |
|---|---|---|---|
| 3,869,292 | A | 3/1975 | Peters |
| 4,115,128 | A | 9/1978 | Kita |
| 4,246,374 | A | 1/1981 | Kopchik |
| 4,377,631 | A | 3/1983 | Toukhy et al. |
| 4,404,272 | A | 9/1983 | Stahlhofen |
| 4,404,357 | A | 9/1983 | Taylor et al. |
| 4,423,138 | A | 12/1983 | Guild |
| 4,424,315 | A | 1/1984 | Taylor et al. |
| 4,439,516 | A | 3/1984 | Cernigliaro et al. |
| 4,491,628 | A | 1/1985 | Ito et al. |
| 4,791,171 | A | 12/1988 | Cunningham |
| 4,931,379 | A | 6/1990 | Brunsvold et al. |
| 4,939,070 | A | 7/1990 | Brunsvold et al. |
| 5,609,989 | A | 3/1997 | Bantu et al. |
| 5,667,938 | A | 9/1997 | Bantu et al. |
| 5,733,705 | A | 3/1998 | Bantu et al. |
| 5,879,856 | A | 3/1999 | Thackeray et al. |
| 5,998,099 | A | 12/1999 | Houlihan et al. |
| 6,037,107 | A | 3/2000 | Thackeray et al. |
| 6,063,542 | A | 5/2000 | Hyeon et al. |

FOREIGN PATENT DOCUMENTS

| DE | 4 207 261 A1 | 9/1993 |
|---|---|---|
| EP | 0 628 876 A1 | 12/1994 |
| EP | 0 789 279 A1 | 8/1997 |
| EP | 0 932 082 A2 | 7/1999 |
| JP | 2000-191732 A1 | 7/2000 |
| JP | 2000-267287 A1 | 9/2000 |
| WO | WO 00/67072 | 11/2000 |

OTHER PUBLICATIONS

Reynolds, Geoffrey W., "Factors contributing to sidewall roughness in a positive-tone, chemically amplified resist exposed by x-ray lithography," J. Vac. Sci. Technol. B 17(2) (Mar./Apr. 1999) pp. 334-344.
Database WPI, Section Ch, Week 199809, Derwent Publications Ltd., London, GB; AN 1998-096984, XP-002192927 & JP 09 325473 A (Nippon Gosei Gomu KK), Dec. 16, 1997.
Wu-Song Huang, SPIE Conference, Polymeric Base Additives for Lithographic Improvement in DUV Resist System, SPIE vol. 3678, pp. 1040-1051, 1999.
Ferreira et al., Choice of Amines as Stabilizers for Chemically Amplified Resist Systems, SPIE vol. 3333, pp. 236-244, 1998.
Kawai et al., Advances in Patterning Characteristics of Chemically Amplified Resists with an Organic Base, Journal of Photopolymer Science and Technology, vol. 11, No. 3, 399-404, 1998.
Ushirogouchi et al., Mechanism of Amine Additive in Chemically Amplified Resist Visualized by Using Monte-Carlo Simulation, SPIE vol. 2438, pp. 609-616, 1995.
Asakawa et al., Effect of Basic Additives on Sensitivity and Diffusion of Acid in Chemical Amplification Resists, SPIE vol. 2438, pp. 563-570, 1995.
Yamaguchi et al., A New Approach for Reducing Line-Edge Roughness by Using a Cross-linked Positive-tone Resist, pp. 158-159.
Sanchez et al., Effect of Aerial Image Contrast on Resist Line-Edge Roughness, Microlithography World, pp. 19-21, 1999.
Sanchez et al., Aerial Image Contrast Using Interferometric Lithography: Effect on Line-Edge Roughness, SPIE vol. 3678, pp. 160-171, 1999.
Brainard et al., Comparison of the Lithographic Properties of Positive Resists Upon Exposure to Deep-and Extreme-Ultraviolet Radiation, J.Vac. Sci. Technol. B 17(6), pp. 3384-3389, 1999.
Hinsberg et al., Factors Controlling Pattern Formation in Chemically Amplified Resists at Sub-100 nm Dimensions, J. Photopolym. Sci. Technol., vol. 12, No. 4, pp. 649-562, 1999.
Wallow et al., Evaluation of Cycloolefin-Maleic Anhydride Alternating Copolymers as Single-Layer Photoresists for 193 nm Photolithography, SPIE vol. 2724, pp. 355-364, 1996.
Palmateer et al., Line Edge Roughness in sub-018-μm Resist Patterns, SPIE Volume, 634-642, 1998.
Geoffrey W. Reynolds and James W. Taylor, Factors Contributing to Sidewall Roughness in a Positive-Tone, Chemically Amplified Resist Exposed by X-ray Lithography, J. Vac. Sci. Technol. B 17(2), pp. 334-344, 1999.
Yamaguchi et al., A New Approach for Reducing Line-Edge Roughness by Using a Cross-Linked Positive Tone-Resist, NTT Basic Research Laboratories, pp. 158-159.
Houlihan et al., A Commericially Viable 193 nm Single Layer Resist Platform, Journal of Photopolymer Science and Technology, pp. 511-520, 1997.

*Primary Examiner*—Amanda Walke
(74) *Attorney, Agent, or Firm*—Thomas J. Engellenner; Reza Mollaaghababa; Nutter McClennen & Fish, LLP

(57) ABSTRACT

Novel photoresists containing at least about 0.2 molar ratio of a base with respect to the concentration of a photoacid generator present and their preparation are described. It has been discovered that inclusion of a sufficient amount of base counteracts the detrimental effects of photoacid generators, thus providing resists having submicron linewidth resolution.

21 Claims, No Drawings

RESIST WITH REDUCED LINE EDGE ROUGHNESS

RELATED APPLICATION

The present application is a continuation of U.S. patent application Ser. No. 09/851,952 filed on May 9, 2001 now U.S. Pat. No. 6,936,398, which is herein incorporated by reference.

The U.S. government has rights in this invention pursuant to a contract awarded by the Department of Defense, Contract No. F19628-00-0002.

BACKGROUND OF THE INVENTION

The present invention relates generally to improved materials and methods for pattern formation on semiconductor wafers, and more particularly, to improved photoresist materials for use in lithography.

Photolithography employs photoresists, which are photosensitive films, for transfer of images, e.g., negative and positive images, onto a substrate, e.g., a semiconductor wafer. Subsequent to coating a substrate with a photoresist, the coated substrate is exposed to a source of activating radiation, which causes a chemical transformation in the exposed areas of the surface. The photo-resist coated substrate is then treated with a developer solution to dissolve or otherwise remove either the radiation-exposed or unexposed areas of the coated substrate, depending on the type of photoresist employed.

A wide variety of energy sources, such as X-rays, extreme ultra violet (EUV), low and high kV electrons, ion beams, and extended optical wavelengths, e.g., 248, 193, and 157 nm radiation, can potentially be employed for advanced sub-100 nm imaging. Conventional microlithography techniques for creation of features having sizes of 100 nanometers or less, however, suffer from a number of shortcomings. For example, linewidth variations of a resist film produced by such techniques can be too large to be acceptable in view of high dimensional tolerances typically required in this range, e.g., tolerances of the order of the scales of the molecular components of the resist film. Such linewidth variations are referred to as line edge roughness (LER).

Line edge roughness (LER) causes linewidth fluctuations that may lead to variations in device characteristics. As critical dimensions for integrated circuits continue to shrink, linewidth fluctuations will play an increasingly significant role in critical dimensions error budget for lithography. Several suspected sources of LER in resist patterns include the reticle quality, the aerial image quality, and resist material properties.

An investigation of LER in resists [S. C. Palmateer, S. G. Cann, J. E. Curtin, S. P. Doran, L, M Erikersen, A. R. Forte, R. R. Kunz, T. M. Lyszczarz, and M. B. Stern, Proc. SPIE, 3333, 634 (1998)] has shown that surface roughness is low at both low and high exposure doses, but is at a maximum at intermediate doses. The affect of the aerial image on LER was described as arising from a similar intermediate dose transition region that would be typical of the edge of the aerial image. In this intermediate dose region, statistical fluctuations in polymer blocking level, composition, and molecular weight would lead to differences in resist development rate, leading to differences in the resulting linewidth. It was also noted that the LER depends on the aerial image contrast, given by the log of the image slope. As such, a low aerial image contrast results in a higher LER due to a larger transition region and a high aerial image contrast results in a lower LER due to a smaller transition region. The underlying resist material properties that lead to LER can be effected by imaging techniques that lead to either higher or lower aerial images. Thus, LER for different resists can only be compared when aerial image contrast is identical, e.g. identical imaging tool and test feature.

The LER of a resist arises from a linkage of the aerial image contrast and the resist material properties. The resist material properties that can be affected are statistical variations in the dispersion of photoacid in the film, statistical variations in the extent of acid catalyzed deprotection, and statistical variations on the solubility of the polymer chains. On average, the site density of photo-generated acid, polymer deprotection, and resist development are uniform. However, at the nanometer level, the local site density can fluctuate and lead to line edge roughness. Both nonuniform acid distribution and polymer deprotection will manifest itself in differential solubility of the polymer matrix in developer and these nonuniformities will be replicated as LER in the final resist image. Evidence for this was provided by Reynolds and Taylor [G. W. Reynolds and J. W. Taylor, J. Vac. Soc. Technol. B, 17, 334 (1999)] who found the largest contributor of LER to be the development process with variations in acid diffusion and shot noise having minimal effects on the overall LER.

The use of base additives in resists employed in the manufacturing of integrated circuits is established. Conventional wisdom in the field has been that the base additive should be present in the photoresist compound at a significantly lower concentration than the photoacid generator so as not to trap and neutralize the acid generated during exposure.

A need exists for photoresists that provide highly resolved fine line images, i.e., photoresists that have minimal to no contribution to LER or variations in line width. It is also desirable to formulate a photoresist that can be imaged at submicron and sub-half micron levels. Further, a need exists for a photoresist where variations in linewidth and line edge roughness are not effected by baking cycles used during manufacturing processes.

SUMMARY OF THE INVENTION

The present invention pertains to polymeric compositions particularly useful in the preparation of photoresists that can be developed at or below 248 nanometers. The photoresists of the invention exhibit substantially no linewidth or line edge roughness (LER) variation. The photoresist compositions include a polymeric resin, as are known in the art, a photoacid generator (PAG) and a base. The molar concentration ratio of the base to the PAG is at least 0.2. The molar concentration ratio of the base to the PAG is preferably less than about 1.5. More preferably, the molar concentration ratio of the base to the PAG is less than about 1. It is found surprisingly that addition of base additives with molar concentration ratios of 0.2 or higher relative to the photoacid generator is highly effective at suppressing LER without sacrificing other desirable resist characteristics.

The resist formulations of the invention include sufficient amount of base to generally buffer the acid generated by the PAG upon irradiation, thereby affording a more homogenous photoresist film. As a result, the low linewidth and/or LER variations of resists according to the invention permit patterning at or below one micron (submicron) resolution. The homogeneity of the composition is considered to be basis for the surprisingly uniform linewidth or low LER of the resultant photoresist. The ability to provide photoresists developed at various wavelengths or energies, such as 248 nm, 193 nm, 157 nm, EUV (e.g., in a range of about 10–20 nm), x-rays, e-beam (high or low voltage e-beam), and/or ion beam, with well defined linewidth and minimized line edge roughness affords a distinct advantage over microlithographic techniques and compositions currently available.

A base additive used in the present invention can be chosen from those that are known in the art, such as primary, secondary, tertiary and quaternary amines. Suitable organic bases include, but are not limited to, tetramethylammonium hydroxide, tetrabutylammonium hydroxide, tetraethanol ammonium hydroxide, 1,4-diazabicylo[2.2.2]octane, 1,5-diazabicyclo[4.3.0]non-5-ene, diazabicyclo[5.4.0]undec-7-ene, triphenyl amine, diphenyl amine, trioctyl amine, triheptyl amine, hexamethylenetetramine, hexamethylenetriethylenetetramine, N-diethyl-N'methylenediamine, 4-aminophenol, and 2-(4-aminophenyl)-2-(4-hydroxyphenyl)propane.

In another aspect, the present invention pertains to methods of preparation of these unique photoresist compositions which represent a fundamentally new type of resist having well defined and controlled linewidths and minimal line edge roughness. One distinct advantage of the method of the invention is its compatibility with conventional resist processing techniques.

In a related aspect, the method of the invention mixes a photoresist polymer with a photoacid generator and a base having a concentration of at least about 0.2 molar ratio relative to the photoacid generator to provide a photoresist composition. The resultant mixture is exposed to radiation to cure the photoresist. Thereafter, the photoresist can be exposed to one or more bake cycles, such as a post exposure bake (PEB). In another aspect, the resultant photoresist can withstand downstream processing, such as sputtering and subsequent treatments with photonic energy and thermal energy.

The photosensitive resist compositions of the invention are sensitive to conventional 455 nm (g-line), 405 nm (h-line), or 365 nm (i-line) radiation as well as ultraviolet (uv) radiation at either 248 or 193 nm. The resists described herein will also be useful at radiation as well as ultraviolet (uv) radiation sub-200 nm wavelengths, such as 157 nm, as well as with EUV, e-beam, x-ray and ion beam sources. The term "actinic radiation" is used herein to generally describe all of the aforementioned lithography sources.

In another aspect, the invention provides a method of generating sub-micron patterns having LER less than about 10 nm on a substrate by applying a film of a photoresist composition to a selected portion of the substrate. The photoresist composition includes a photoresist polymer, a photoacid generator and a base having a molar concentration ratio of at least 0.2 relative to the photoacid generator. The photoresist film is exposed to actinic radiation to generate the pattern. The wavelength of the actinic radiation can be, for example, 157 nm, 193 nm, or 14 nm.

Other advantages of the invention will be readily apparent to one having ordinary skill in the art upon reading the following description.

All percentages by weight identified herein are based on the total weight of the photosensitive resist composition unless otherwise indicated.

DETAILED DESCRIPTION

The present invention provides photoresists and methods to prepare photoresists having reduced LER by adding relatively large amounts of a base additive in the resist formulation. The amount of base additive is generally predicated on the concentration of photoacid generator (PAG) present in the photoresist composition. Generally, a photoresist formulation according to the teachings of the invention has a base to PAG molar concentration ratio of at least about 0.2. More preferably, the base to PAG molar concentration ratio is in a range of about 0.3 to about 0.8, and most preferably in a range of about 0.4 to about 0.6. The weight percent concentration of the base, exclusive of the solvent, in a photocomposition of the invention can be in a range of about 0.4 to about 2.0.

The resin compositions useful in the invention are non-limiting, and can be chosen from those resin binder systems currently available to those of ordinary skill in the art. For example, most commercial photoresist formulations, both positive and negative, include a film forming resin binder and a radiation sensitive component, e.g., a photo acid generator (PAG). Examples of resin binders suitable for use in the present invention include, acrylate based polymers, methacrylate based polymers, hydroxy styrene based polymers, such as t-BOC p-hydroxy styrene/p-hydroxy styrene copolymers, t-butyl acrylate/p-hydroxy styrene copolymers or t-butylacrylate/p-hydroxystyrene/styrene terpolymers, cycloolefin based polymers, novalacs, and hexafluoroisopropanol (HFIP) styrene base polymers.

Other suitable resin compositions can include cycloolefin based polymers or copolymers, such as cycloolefin-maleic anhyrdride alternating copolymers, homopolymers and maleic anhydride copolymers of norbonadiene, copolymers of fluorinated alcohol-substituted polycyclic ethylinically unsaturated comonomer, and polymers and copolymers containing alcohol functional groups attached to aromatic moieties. Examples of cycloolefin-maleic anhydride copolymers can be found in "Macromolecules", 30, pages 6517–6534 (1997), F. M. Houlihan et al., and in SPIE, Vol. 2724, pages 355–364, T. Wallow et al., and in Journal of Photopolymer Science and Technology, 10, No. 3, pages 511–520 (1997), F. M. Houlihan et al., all of which are herein incorporated by reference. Examples of copolymers containing fluorinated alcohol-substituted polycyclic ethylinically unsaturated monomeric units can be found in "Synthesis and Evaluation of Alicyclic Backbone Polymers for 193 nm Lithography", Chapter 16, ACS Symposium Series 706(Micro- and Nano-patterning Polymers) pages 208–223 (1998), herein incorporated by reference. Further, examples of polymers containing fluorinated alcohol functional groups attached to aromatic moieties can be found in "Hexafluoroacetone in Resist Chemistry: A Versatile New Concept for Materials for Deep UV Lithography", SPIE Vol. 1672, (1992), pages 500–512, K. J. Przybilla et al., herein incorporated by reference.

Many film forming binders currently available are phenolic resins. For example, most positive acting photoresists currently utilized in commercial applications are based on novolak resin and a naphthoquinone diazide sulfonic acid ester photoactive compound where the novolak resin is the reaction product of formaldehyde and a phenol. Examples of such compositions are disclosed in U.S. Pat. Nos. 4,377,631 and 4,404,272, both incorporated herein by reference. Another class of positive acting photoresists includes poly (vinylphenol) and a naphthoquinone diazide acid ester. Suitable examples of these compositions are disclosed in U.S. Pat. Nos. 3,869,292 and 4,439,516, both incorporated herein by reference.

In certain embodiments, phenol-based polymers suitable for use in a composition of the invention can include novolak and poly(vinylphenol) resins and copolymers of the same with styrene and/or alpha-methylstyrene. Novolak resins are thermoplastic condensation products of a phenol, a naphthol or a substituted phenol, such as, cresol, xylenol, ethylphenol, butylphenol, isopropyl methoxyphenol, chlorophenol, bromophenol, resorinol, naphthol, chloronaphthol, bromonaphthol or hydroquinone with formaldehyde, acetaldehyde, benzaldehyde, furfural acrolein, or the like. Further examples of novolak resins are disclosed in U.S. Pat. Nos. 3,148,983; 4,404,357; 4,115,128; 4,377,631; 4,423,138; and 4,424,315, the disclosures of which are incorporated herein by reference.

Other phenol-based resins suitable for the radiation sensitive compositions according to the invention include copolymers of phenols and nonaromatic cyclic alcohols analogous in structure to the novolak resins and the poly(vinylphenol) resins. Such copolymers provide radiation sensitive compositions with relatively greater transparency to activating radiation. These copolymers can be formed in several ways. For example, in the conventional preparation of a poly(vinylphenol) resin, a cyclic alcohol can be added to the reaction mixture during the polymerization reaction, which is thereafter carried out in normal manner. The cyclic alcohol is preferably aliphatic, but can contain one or two double bonds. The cyclic alcohol is preferably selected to be one with a structure closest to phenol. For example, if the resin is poly(vinylphenol), the comonomer is selected to be vinyl cyclohexanol.

Examples of phenol-based resins include poly(vinylphenol) resins, which are thermoplastic polymers formed, for example, by block polymerization, emulsion polymerization or solution polymerization of the corresponding monomers in the presence of a cationic catalyst. Vinylphenols useful for the production of poly(vinylphenol) resins can be prepared, for example, by hydrolysis of commercially available coumarin or substituted coumarins, followed by decarboxylation of the resulting hydroxy cinnamic acids. Useful vinylphenols can also be prepared by dehydration of the corresponding hydroxy alkyl phenols or by decarboxylation of hydroxy cinnamic acids resulting from the reaction of substituted or non-substituted hydroxybenzaldehydes with malonic acid. Alternatively, polyvinyl phenol resins can be prepared by the direct polymerization of vinylphenol or by polymerizing acetoxy blocked vinyl phenol.

Other resins suitable for the practice of the invention include polymers made from polystyrene maleimides with pendant acid labile functionalities. Examples of useful polymers include those disclosed in U.S. Pat. Nos. 4,931,379, and 4,939,070, both of which are incorporated herein by reference. Vinylic polymers containing recurrent pendant group are also useful and are disclosed in U.S. Pat. No. 4,491,628, incorporated herein by reference.

Polyglutarimides, prepared for example according to U.S. Pat. No. 4,246,374, incorporated herein by reference, are another class of suitable resins. In one embodiment, a resist can be prepared from a polyglutarimide that is soluble in aqueous base and contains at least 40 weight percent of the nitrogen atoms in the form of NH or ammonia groups.

Suitable resin binders for use in accordance with the invention can also include phenol-based polymers that are partially silylated. For example, a silylated polymer as disclosed in U.S. Pat. No. 4,791,171, the contents of which are incorporated herein by reference can be used. Such partially silylated poly(vinylphenol) polymers can be prepared by derivatizing the phenolic hydroxide moieties of a poly(vinylphenol) with suitable organosilicon compounds. Such derivatization can be accomplished, for example, by condensation of a poly(vinylphenol) with an organosilicon compound that has a suitable leaving group, for example trimethylsilylmethylchloride, bromide, mesylate or tosylate; trimethylsilylchloride, bromide, cyanide or mesylate; phenyldimethylsilylchloride; or t-butyldimethylsilylchloride.

A base additive suitable for use in the present invention can be chosen from those that are known in the art, such as primary, secondary, tertiary and quaternary amines. Suitable organic bases include, but are not limited to, tetramethylammonium hydroxide, tetrabutylammonium hydroxide, tetraethanol ammonium hydroxide, 1,4-diazabicylo[2.2.2]octane, 1,5-diazabicyclo[4.3.0]non-5-ene, diazabicyclo[5.4.0]undec-7-ene, triphenyl amine, diphenyl amine, trioctyl amine, triheptyl amine, hexamethylenetetramine, hexamethylenetriethylenetetramine, N-diethyl-N'methylenediamine, 4-aminophenol, and 2-(4-aminophenyl)-2-(4-hydroxyphenyl)propane.

Compositions according to the invention also include at least one photo-acid generator (PAG). The term "photo-acid generator" (PAG) is recognized in the art and is intended to include those compounds which generate acid in response to radiant energy. Preferred photoacid generators for use in the present invention are reactive to radiant energy having a wavelength equal to or less than 455 nm. More specifically, a PAG for use in a composition of the invention should respond to energies at one or more wavelengths or energies such as 248 nm, 193 nm, 157 nm, EUV, x-rays, e-beam (high or low voltage e-beam), and/or ion beam. The photo-acid generator should also be soluble in the polymer resin or in an organic solvent. Preferably, the solution of the photo-acid generator and polymer in the organic solvent are suitable for spin coating. The photo-acid generator components can include a plurality of such compounds. A composition of the invention includes photo-acid generators at levels between about 0.01% and about 50%, more preferably between about 0.5% and about 20%, and most preferably between about 1.0% and about 10%, based on the total weight of the photoresist composition.

Examples of suitable photo-acid generators include onium salts, such as triphenylsulfonium salts, sulfonium salts, iodonium salts, diazonium salts and ammonium salts, 2,6-nitrobenzylesters, 1, 2, 3-tri(methanesulfonyloxy)benzene, sulfosuccinimides and photosensitive organic halogen compounds as disclosed in Japanese Examined Patent Publication No. 23574/1979.

Examples of diphenyliodonium salts include diphenyliodonium triflate (DPI-105, Midori Kagaku Co. Ltd.) and diphenyliodonium tosylate (DPI-201, Midori Kagaku Co. Ltd.). Examples of suitable bis(4-tert-butylphenyl)iodonium salts include bis(4-tert-butylphenyl)iodonium triflate (BBI-105, Midori Kagaku Co. Ltd.), bis(4-tert-butylphenyl)iodonium camphorsulfate (BBI-106, Midori Kagaku Co. Ltd.), bis(4-tert-butylphenyl)iodonium perfluorbutylate (BBI-109, Midori Kagaku Co. Ltd.) and bis(4-tert-butylphenyl)iodonium tosylate (BBI-201, Midori Kagaku Co. Ltd.). Suitable examples of triphenylsulfonium salts include triphenylsulfonium hexafluorophosphite (TPS-102, Midori Kagaku Co. Ltd.), triphenylsulfonium triflate (TPS-105, Midori Kagaku Co. Ltd.) and triphenylsulfonium perfluorobutylate (TPS-109, Midori Kagaku Co. Ltd.).

Specific examples of photosensitive organic halogen compounds include halogen-substituted paraffinic hydrocarbons such as carbon tetrabromide, iodoform, 1,2,3,4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing s-triazines such as tris(trichloromethyl)-s-triazine, tris(tribromomethyl)-s-triazine, tris(dibromomethyl)-s-triazine and 2,4-bis(tribromomethyl)-6-methoxyphenyl-s-triazine; halogen-containing benzenes such as (bis(trichloromethyl)benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate. Among such photosensitive organic halogen compounds, a bromine-containing compound is particularly preferred.

In addition to the hydroxyl protected polymer and photoacid generator, the compositions of the invention can include small molecules, which help to inhibit hydrolysis of the protected hydroxyl groups. These small molecules are typically ester, ether, ketal or acetal protected low molecular weight polyhydridic alcohols or low molecular weight alcohols. Suitable low molecular weight hydrolysis inhibitors include, for example, Di-BOC Bisphenol A, Di-BOC o-cresolphthalein, tert-butyl lithocholate and tert-butyl deoxycholate (available from Midori Kagaku Col, Ltd. Tokyo, Japan).

A photosensitive composition of the present invention can be utilized by dissolving it in a solvent. Any suitable solvent can be utililzed so long as it is capable of presenting adequate solubility to the resin and additional components, e.g., base and PAG, and it can provide good coating properties. For example, the solvent can be a cellosolve type solvent such as methyl cellosolve, ethyl cellosolve, methyl cellosolve acetate or ethyl cellosolve acetate. Ethylene glycol based solvents such as ethylene glycol monomethyl ether, diethylene glycol monomethyl ether, diethylene glycol dibutyl ether, diethylene glycol and diethylene glycol dimethyl ether are also suitable as organic solvents for the photosensitive compositions of the invention. Further, propylene glycol based solvents such as propylene glycol monoethyl ether, propylene glycol monobutyl ether, propylene glycol monomethyl ether acetate, dipropylene glycol dimethyl ether or propylene glycol monoethyl ether acetate can be used. Suitable ester type solvents include butyl acetate, amyl acetate, ethyl butyrate, butyl butyrate, diethyl oxalate, ethyl pyruvate, ethyl-2-hydroxybutyrate, 2-methylacetoacetate, methyl lactate or ethyl lactate. Alternatively, alcohols are utilized and include heptanol, hexanol, nonanol, diacetone alcohol or furfuryl alcohol. Examples of suitable ketone solvents include cyclohexanone or methylamyl ketone. Ethers useful as solvating agents include methyl phenyl ether or diethylene glycol dimethyl ether. Polar solvents, such as dimethylformamide or N-methylpyrrolidone can also be used. A solvent can be used alone or as combinations of two or more solvents. The solvent is typically used in an amount of from 1 to 100 times by weight relative to the total amount of the solid content of the photosensitive composition.

Further, the photosensitive composition of the present invention can contain various additives such as a surfactant, a coating property-improving agent, a stabilizer, a colorant and an ultraviolet absorber, to such an extent as not to impair the desired properties.

Suitable surfactants which can be added to a photosensitive composition of the invention to improve its coating ability include, for example, nonionic surfactants. Such nonionic surfactants can include polyoxyethylene alkyl ethers such as polyoxyethylene lauryl ether, polyoxyethylene stearyl ether and polyoxyethylene oleyl ether, polyoxyethylene alkylphenyl ethers such as polyoxyethylene octylphenyl ether and polyoxyethylene nonylphenyl ethers.

Further, suitable nonionic ester surfactants include polyethylene glycol dialkyl esters, such as polyethylene glycol dilaurate and polyethylene glycol distearate. Alternatively, fluorine-containing surfactants can be utilized which contain a fluoroalkyl or perfluoroalkyl group such as Efftop EF301, EF303 and EF352 (manufactured by Shinakitakasei Co., Ltd.), Megafac F171, F172 and F173 (manufactured by Dainippon Ink Co., Ltd.), Asahiguard AG710 (manufactured by Asahi Glass Co., Ltd.), Florade FC430 and FC431 (manufactured by Sumitomo 3M Co., Ltd.), and Surflone S-382, SC101, SC102, SC103, SC104, SC105 and SC106 (manufactured by Asahi Glass Co., Ltd.). Organosiloxane surfactants, such as organosiloxane polymer KP341 (manufactured by Shinetsu Kagaku Kogyo Co., Ltd.) are also suitable for decreasing the surface tension of the solution containing the photosensitive composition. Additionally, acrylic acid- or methacrylic acid-type polymers and copolymers such as Polyflow No. 75, No. 95 and WS (manufactured by Kyoeisha Yushikagaku Kogyo Co., Ltd.); and the like are also suitable surfactants. The amount of the surfactant to be added is usually less than 2 parts by weight, preferably 0.005–1 part by weight, per 100 parts by weight of the abovementioned condensate.

Furthermore, antioxidants or defoaming agents can be included in a composition of the invention, as required to attenuate the radiation-sensitive composition of this invention.

The photoresists of the invention have a LER of generally less than about 10 nanometers, and more preferably less than about 8 nanometer, and most preferably less than about 5 nanometers.

Not to be limited by theory, it is believed that addition of a relatively large amount of base to PAG in a composition of the invention causes a greater amount of PAG to convert to acid, upon photoactivation of the composition, than would normally occur with a lower amount of base present (those amounts conventionally utilized to stabilize resin formulations). The generation of acid from PAG is a statistical process in that it occurs randomly throughout the imaged resist in response to the presence of photons, electrons, and/or ions impinging on the resist. The generated acid must diffuse throughout the resist in order to catalytically deprotect protected sites. The random nature of this diffusion process causes variations in the amounts of deprotection in various areas of the resist. That is, it causes certain areas of the resist to have relatively large amount of deprotection and hence a high dissolution rate while other areas have relatively low amounts of deprotection and hence a low dissolution rate. Further, no resist dissolution occurs in areas where the level of deprotection is too low. The occurrence of this random dissolution rate at line edges of a resist may be responsible for line edge roughness observed in many of present day resists. In contrast, the increased conversion of PAG to acid in a composition of the invention is considered to provide a more uniform acid distribution in the resist and also a more uniform acid catalyzed deprotection of the blocking groups (if present). A more uniform deprotection of the blocking groups leads to more uniform resist dissolution, on a nanometer scale, hence resulting in reduced line edge roughness in the resist.

Thus, the presence of a relatively large amount of base in a resist of the invention forces a higher level of PAG conversion to occur, hence generating a larger amount of acid which is more uniformly distributed in the resin. Further, the base reduces the catalytic efficiency of the acid. The terms "buffer" and "buffering" as used herein are intended to generally describe and encompass this reduction in catalytic efficiency. The base, in a sense, acts to partially neutralize the acid through formation of a salt of a relatively strong acid and strong base. This in situ formed salt has a lower dissociation in the resist than in free form. The lower salt dissociation, in turn, is considered to reduce the amount of free acid available to catalyze deprotection reactions. Thus, acid catalyzed deprotection occurs at a lower rate. A more uniform acid distribution results in less variation in the degree of blocking group deprotection along a line edge. This in turn reduces the degree of resist dissolution along the resist line edge and leads to more uniform resist dissolution. This feature of a resist of the invention contributes to lower observed line edge roughness on the scale of micron to submicron resolution. In sum, the base creates a buffering effect on the acid generated by the PAG, and produces a more uniform conversion of deprotected sites.

It is also possible that a high level of PAG conversion in a resist formulation of the invention removes unconverted PAG as a site for microsegregation in the resist. Mircosegregation can occur if protected (nonpolar) and unprotected or partially protected (both nonpolar) polymers segregate on the sub-micrometer or even nanometer scale. This can lead to areas of high and low resist dissolution. If this microsegregation occurs at the line edge, then an increase in LER will occur, i.e. impeded resolution greater than submicron variations. The presence of the relatively large amount of base in a composition of the invention is believed to force a relatively large amount of PAG conversion, thus reducing the level of unconverted PAG which can act as a site for microsegregation. With either explanation for the reduction of LER, the presence of a relatively large amount of base is required as part of the resist formulation of the invention Prior to the present invention, it was generally considered that significant amount of base in a photoresist formulation, e.g., greater than 0.1 molar ratio of base to PAG, would lead to a loss in photosensitivity and/or photospeed. In contrast to these conventionally accepted norms, it has been discovered that photoresist formulations that contain 0.2 molar ratio (based on the concentration of PAG present) do not have significant loss of photosensitivity or photospeed. In fact, such formulations have much finer line resolution than similar formulations that do not include higher levels of base.

Thus, the resists of the present invention address the aforementioned shortcomings of currently commercially available resists. In particular, the resists of the present invention provide resolution(s) having signficantly lower LER, e.g., micron to submicron resolution, than those of presently available resists which are based on similar polymer platforms. One important advantage of the present invention is that currently available commercial resist formulations can be modified for preparation of the resists that are subject of the present invention. One such modification can include addition of base to a resist composition to provide a resultant resist having enhanced performance characteristics.

One embodiment of the present invention provides a resist, having relatively large amounts of base, that is particularly suitable for 157 nm lithography. The presence of a relatively large amount of base can reduce the resist sensitivity, and hence reduce the manufacturing throughput, as a result of partial neutralization of the photogenerated acid. In 157 nm lithography, however, the relatively large absorbance of the resist leads to production of a relatively large amount of acid during exposure. The presence of a large amount of acid in turn allows the use of relatively large amounts of base in the resist formulation of this embodiment of the invention without degrading the resist sensitivity and/or the manufacturing throughput.

Other exposure sources, in which a high degree of exposure energy is absorbed in the resist, can also benefit from reduced LER attained through incorporation of relatively large amounts of base in a resist formulation according to the invention. Extreme ultraviolet (EVU), low voltage electron beams, and ion beams are some examples of other types of energy that can be utilized in advanced lithography in conjunction with photoresists of the invention.

A hard-mask process is an exemplary technique that can utilize a thin layer of a resist according to the teachings of the invention for lithography at 157 nm. In a hard-mask process, a thin imaging resist provides a coating for a thicker non-imaging substrate. The non-imaging substrate is typically an inorganic material, such as silicon nitride or silicon oxynitride. The inorganic material is selected to have relatively high plasma etch selectivity compared to the material that it will be masking. An image formed on the thin imaging resist is transferred to the thicker non-imaging underlying substrate by a selective plasma etching process. The transfer of the image onto the non-imaging substrate produces a hard mask that can be employed as a resist in subsequent etching or implantation steps.

Thin layer imaging techniques, such as top-surface-imaging (TSI) and bilayers including hard-mask process described above, are promising candidates for high resolution patterning. They can be utilized to either extend optical lithography, e.g., imaging at 157 nm, to smallest dimensions possible, or be utilized as alternatives for post-optical lithographical techniques, such as extreme ultraviolet or low-energy electron imaging. However, prior to the present surprising discovery, the high level of edge and surface roughness exhibited by both chemically amplified (CA) and non-CA TSI resists become problematic as critical dimensions shrink to 100 nm and less. Linewidth variations caused by 5 to 10 nm of LER consume an increasing amount of the critical dimension, decrease the process latitude, and can degrade device performance, uniformity, and ultimately, wafer yield. For example, in a hard-mask process, the LER of the resist transfers directly onto the hard mask underlayer and further transfers from the hard-mask to the substrate. As discussed above, the present invention provides substantially eliminates the LER, thus providing a solution for the above problems.

The following examples serve to further describe the invention.

EXPERIMENTAL

In the examples that follow, the polymers and PAGs listed below were utilized to form resists in accord with the teachings of the invention:

List of Chemicals:
Polymer 60:40: a copolymer of p-hydroxystyrene and t-butyl acrylate with a monomer ratio of 60% p-hydroxystyrene and 40% t-butyl acrylate
PAG TBPI-CS: di-t-butylphenyl iodonium camphor sulfonate
PAG TBPI-FOB: t-butylphenyl iodonium perfluorobutyl sulfonate
Base TBAH: tetrabutyl amonium hydroxide
Base DABU: 1,8-diazabicyclo[5,4,0]undec-7-ene
Base DPA: di-phenyl amine
Base TOA: tri-octyl amine Further, the following general process conditions were utilized:

A post apply bake (PAB) step was performed by placing the silicon wafer on a hot plate at a desired temperature and for a desired time period. Development was accomplished by utilizing Shipley LLD-26W, a commercial resist developer. The clearing dose ($E_0$), defined as the lowest exposure dose required to remove all resist after development, was determined by either fitting a line through all points containing less then 80% normalized film thickness as a function of dose and determining the intercept for zero remaining film thickness, or if no slope could be determined, by noting the lowest exposure dose for which no resist remained. The unexposed film thickness loss (UFTL) was determined by subtracting the film thickness of an unexposed portion of the resist after development from the film thickness of the resist prior to exposure. The sizing dose ($E_{size}$) is defined as the dose that gives a measured linewidth closest to the nominal linewidth of a given feature size. For 157-nm lithography, the nominal linewidth is 200 nm, and for EUV lithography, the nominal linewidth is 100 nm. The sizing dose was determined by measuring the linewidth at multiple doses and selecting the dose at which the measured linewidth is closest to the nominal linewidth.

The resolution for 157-nm imaging was determined by exposing the resist through a chrome on quartz mask containing dense features of 250, 200, 180, and 150 nm and determining the smallest feature that was printed. The resolution for EUV imaging was determined by exposing the resist through a reflectance mask containing dense features of 100, 90, 80, and 70 nm and determining the smallest feature that was printed. The LER was determined by measuring the linewidth of a target dense features at multiple locations on multiple lines and then determining the standard deviation of the linewidth. For 157-nm lithography, the target feature was 200 nm and for EUV lithography the target feature was 80 nm. The LER is given by dividing the standard deviation by two and is reported in units of nanometers. Values of LER for 157-nm imaging of less then 5.0 nm are considered to be low, values between 5.0 and 10.0 nm are considered to be moderate, and values greater then 10.0 are considered to be large. Values of LER for EUV imaging of less then 10.0 nm are considered to be low values and values greater then 10.0 are considered to be large. The LER values depend on both the resist and the exposure system. Hence, resists cannot be compared by utilizing different exposure systems. Rather, resistes can only be ranked relative to one another on equivalent exposure systems.

Example 1

Preparation of Positive Acid Catalyzed Resists (Varying TBAH Base Additive Level)

A number of resists were prepared by adding polymer, PAG, and base in the amounts listed below to 2757 parts of ethyl lactate solvent to make an approximately 3.5% weight of solids to total weight solution. The solution was rolled over night and filtered through a 0.2 μm filter. Table 1 lists a plurality of resists produced in this manner.

Table 2 presents $E_0$, UFTL, resolution, and LER values determined for the resists listed in Table 1. To determine $E_0$ and UFTL, the resists were spin cast to an approximately 55 nm film on a HMDS vapor primed silicon wafer followed by a PAB at 140° C. for 60 seconds. The resist was exposed to 157 nm light at a series of different doses between 0 and 10 mJ/cm². After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. For each resist, the $E_0$ and UFTL were then determined and are reported below.

To determine resolution and LER, each resist was spin cast to an approximately 55 nm film on a HMDS vapor primed silicon wafer followed by a PAB at 130° C. for 60 seconds. The resist was exposed to 157 nm light through a chrome on quartz mask at a series of different doses and focuses. After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The resolution and LER were then determined and are reported below.

TABLE 1

| Resist | Amount | Polymer | Amount | PAG | Amount | Base | Ratio B/P |
|--------|--------|---------|--------|-----|--------|------|-----------|
| 99090 | 94 | 60:40 | 6 | TBPI-CS | 0.40 | TBAH | 0.160 |
| 99091 | 94 | 60:40 | 6 | TBPI-CS | 0.80 | TBAH | 0.321 |
| 99071 | 94 | 60:40 | 6 | TBPI-CS | 1.20 | TBAH | 0.481 |
| 99098 | 94 | 60:40 | 6 | TBPI-CS | 1.60 | TBAH | 0.642 |
| 99099 | 94 | 60:40 | 6 | TBPI-CS | 2.00 | TBAH | 0.802 |

TABLE 2

| Resist | $E_0$ (mJ/cm²) | UFTL (normalized) | Resolution (μm) | LER (nm) |
|--------|----------------|-------------------|-----------------|----------|
| 99090 | 0.21 | 2.0 | 200 | 8.2 |
| 99091 | 0.25 | 1.7 | 200 | 4.1 |
| 99071 | 0.42 | 5.3 | 180 | 4.0 |
| 99098 | 0.71 | 3.8 | 180 | 4.1 |
| 99099 | 0.67 | 2.9 | 180 | 2.0 |

The results demonstrate that the levels of PAG, base, and t-butyl ester in a resist affect its resolution and LER. Resists 99090, 99091, 99071, 99098, and 99099 all showed sufficient sensitivity and acceptable UFTL to be employed as 157 nm sensitive resists. Resist 99090 had lower resolution and high LER compared to Resist 99071. This can be attributed to a lower amount of base present in the resist formulation. Resist 99091 had lower resolution but similar LER to Resist 99071, thus showing that high base levels can improve LER even when the resist formulation leads to lower resolution. Resists 99071 and 99098 had very low LER and Resist 99099 had virtually no detectable LER. This showed that high base levels decrease LER to the point that it is virtually eliminated.

Example 2

Preparation of Positive Acid Catalyzed Resists (Varying Base DABU Additive Level)

A number of resists were prepared by adding polymer, PAG, and base in the amounts listed below in Table 3 to 2757 parts of ethyl lactate solvent to make an approximately 3.5% weight of solids to total weight solution. The solution was rolled over night and filtered through a 0.2 μm filter.

Table 4 presents values of $E_0$, UFTL, resolution, and LER determined for the resists listed in Table 3. To determine $E_0$ and UFTL, each resist was spin cast to an approximately 55 nm film on a HMDS vapor primed silicon wafer followed by a PAB at 140° C. for 60 seconds. The resist was exposed to 157 nm light at a series of different doses between 0 and 10 mJ/cm². After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. For each resist, the $E_0$ and UFTL were then determined and are reported below.

To determine resolution and LER, each resist was spin cast to an approximately 55 nm film on a HMDS vapor primed silicon wafer followed by a PAB at 130° C. for 60 seconds. The resist was exposed to 157 nm light through a chrome on quartz mask at a series of different doses and focuses. After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The resolution and LER were then determined and are reported below.

TABLE 3

| Resist | Amount | Poly-mer | Amount | PAG | Amount | Base | Ratio B/P |
|---|---|---|---|---|---|---|---|
| 99084 | 94 | 60:40 | 6 | TBPI-CS | 0.40 | DABU | 0.274 |
| 99100 | 94 | 60:40 | 6 | TBPI-CS | 0.80 | DABU | 0.547 |
| 99085 | 94 | 60:40 | 6 | TBPI-CS | 1.20 | DABU | 0.821 |

TABLE 4

| Resist | $E_0$ (mJ/cm²) | UFTL (normalized) | Resolution (μm) | LER (qualitative) |
|---|---|---|---|---|
| 99084 | 0.34 | 3.5 | 200 | 4.4 |
| 99100 | 1.48 | 9.9 | 200 | 14.0 |
| 99085 | >10.00 | 9.5 | None | NA |

These results also show that the level of PAG, base, and t-butyl ester have an effect on resolution and LER. Resist 99084 and 99100 had sufficient sensitivity and acceptable UFTL to be employed as a 157 nm sensitive resist while Resist 99085 did not show any imaging at 157 nm. This signifies that high base levels can improve LER even when the resist formulation leads to lower resolution. Resist 99100 had increased LER relative to Resist 99084 and a large decrease in sensitivity relative to 99084. The increased level of base in Resist 99100 did not improve the resist performance relative to Resist 99084. Resist 99085 may not have imaged due to the fact that the level of base in the resist was too high in relationship to the level of PAG.

Example 3

Preparation of Positive Acid Catalyzed Resists (Varying DPA Base Additive Level)

A number of resists were prepared by adding polymer, PAG, and base in the amounts listed below in Table 5 to 2757 parts of ethyl lactate solvent to make an approximately 3.5% weight of solids to total weight solution. The solution was rolled over night and filtered through a 0.2 μm filter.

Table 6 provides the values of $E_0$, UFTL, resolution, and LER determined for the resists listed in Table 5. To determine $E_0$ and UFTL, each resist was spin cast to an approximately 55 nm film on a HMDS vapor primed silicon wafer followed by a PAB of 140° C. for 60 seconds. The resist was exposed to 157 nm light at a series of different doses between 0 and 10 mJ/cm². After exposure, the wafer was PEB baked for 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. For each resist, the $E_0$ and UFTL were then determined and are reported below.

To determine resolution and LER, each resist was spin cast to an approximately 55 nm film on a HMDS vapor primed silicon wafer followed by a PAB at 130° C. for 60 seconds. The resist was exposed to 157 nm light through a chrome on quartz mask at a series of different doses and focuses. After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The resolution and LER were then determined and are reported below.

TABLE 5

| Resist | Amount | Poly-mer | Amount | PAG | Amount | Base | Ratio B/P |
|---|---|---|---|---|---|---|---|
| 99086 | 94 | 60:40 | 6 | TBPI-CS | 0.40 | DPA | 0.246 |
| 99101 | 94 | 60:40 | 6 | TBPI-CS | 0.80 | DPA | 0.492 |
| 99087 | 94 | 60:40 | 6 | TBPI-CS | 1.20 | DPA | 0.738 |

TABLE 6

| Resist | $E_0$ (mJ/cm²) | UFTL (normalized) | Resolution (μm) | LER (nm) |
|---|---|---|---|---|
| 99086 | 0.20 | 2.4 | 250 | 6.8 |
| 99101 | 0.22 | 3.6 | 200 | 6.7 |
| 99087 | 0.15 | 2.1 | 200 | 15.8 |

The results demonstrate that the level of PAG, base, and t-butyl ester can have an effect on resolution and LER. Resists 99086, 99087 and 99101 had sufficient sensitivity and acceptable UFTL to be employed as a 157 nm sensitive resists. This signified that even the presence of high base levels may not give low LER if the resist is of very high sensitivity.

It is possible that the DPA base, being a secondary amine, while still useful in suppressing LER is not as effective in reducing the LER as the TBAH, which is a quaternary amine.

Example 4

Preparation of Positive Acid Catalyzed Resists (Varying TOA Base Additive Level)

A number of resists were prepared by adding polymer, PAG, and base in the amounts listed below in Table 7 to 2757 parts of ethyl lactate solvent to make an approximately 3.5% weight of solids to total weight solution. The solution was rolled over night and filtered through a 0.2 μm filter.

Table 8 presents the values of $E_0$, UFTL, resolution, and LER determined for the resists listed in Table 7. To determine $E_0$ and UFTL, each resist was spin cast to an approximately 55 nm film on a HMDS vapor primed silicon wafer followed by a PAB at 140° C. for 60 seconds. The resist was exposed to 157 nm light at a series of different doses between 0 and 10 mJ/cm². After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The $E_0$ and UFTL were then determined and are reported below.

To determine resolution and LER, each resist was spin cast to an approximately 55 nm film on a HMDS vapor primed silicon wafer followed by a PAB at 130° C. for 60 seconds. The resist was exposed to 157 nm light through a chrome on quartz mask at a series of different doses and focuses. After exposure, the wafer was PEB baked at 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The resolution and LER were then determined and are reported below.

TABLE 7

| Resist | Amount | Polymer | Amount | PAG | Amount | Base | Ratio B/P |
|---|---|---|---|---|---|---|---|
| 99088 | 94 | 60:40 | 6 | TBPI-CS | 0.40 | TOA | 0.118 |
| 99089 | 94 | 60:40 | 6 | TBPI-CS | 0.80 | TOA | 0.353 |
| 99102 | 94 | 60:40 | 6 | TBPI-CS | 1.20 | TOA | 0.471 |
| 99103 | 94 | 60:40 | 6 | TBPI-CS | 1.60 | TOA | 0.589 |
| 99104 | 94 | 60:40 | 6 | TBPI-CS | 2.00 | TOA | 0.706 |

TABLE 8

| Resist | $E_0$ (mJ/cm²) | UFTL (normalized) | Resolution (μm) | LER (nm) |
|---|---|---|---|---|
| 99088 | 0.37 | 2.1 | 180 | 7.0 |
| 99089 | 0.69 | 1.6 | 180 | 4.5 |
| 99102 | 0.76 | 2.4 | 200 | 4.3 |
| 99103 | 1.12 | 1.9 | 200 | 12.8 |
| 99104 | 1.44 | 2.3 | 200 | 14.4 |

The levels of PAG, base, and t-butyl ester had an effect on resolution and LER. Resist 99088, 99089, 99102, 99103, and 99104 had sufficient sensitivity and acceptable UFTL to be employed as a 157 nm sensitive resists. Resist 99088 and 99089 have similar resolutions but Resist 99089, having a higher level of base, has a lower LER. Resist 99102 has a similar LER and sensitivity to Resist 99089 even with a higher base level in the resist. Resists 99103 and 99104 have the lowest sensitivity of the five resists but also the highest LER. This showed that low sensitivity does not insure low LER and that reducing the resist sensitivity by adding base does not insure low LER. It is possible that the TOA base, being a tertiary amine, while still useful suppressing LER is not as effective in reducing the LER as the TBAH, which is a quaternary amine. The TOA base does appear to be more effective in suppression LER than the DPA, which is a secondary amine.

Example 5

Preparation of Positive Acid Catalyzed Resists (Varying TBAH Base Additive Level)

The resists were prepared by adding the polymer, PAG, and base in the amounts listed below in Table 9 to 2757 parts of ethyl lactate solvent to make an approximately 3.5% weight of solids to total weight solution. The solution was rolled over night and filtered through a 0.2 μm filter.

Table 10 presents the values of $E_0$, UFTL, resolution, and LER determined for the resists listed in Table 9. To determine $E_0$ and UFTL, each resist was spin cast to an approximately 55 nm film on a HMDS vapor primed silicon wafer followed by a PAB of 140° C. for 60 seconds. The resist was exposed to 157 nm light at a series of different dose between 0 and 10 mJ/cm². After exposure, the wafer was PEB baked for 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The $E_0$ and UFTL were then determined and are reported below.

To determine resolution and LER, each resist was spin cast to an approximately 55 nm film on a HMDS vapor primed silicon wafer followed by a PAB of 130° C. for 60 seconds. The resist was exposed to 157 nm light through a chrome on quartz mask at a series of different doses and focuses. After exposure, the wafer was PEB baked for 130° C. for 90 seconds. The wafer was then immersed in a surfactant containing 2.38% aqueous tetramethyl ammonium hydroxide solution for 15 seconds, removed and rinsed with DI water, and dried under a stream of nitrogen gas. The resolution and LER were then determined and are reported below.

TABLE 9

| Resist | Amount | Polymer | Amount | PAG | Amount | Base | Ratio B/P |
|---|---|---|---|---|---|---|---|
| 99105 | 94 | 60:40 | 6 | TBPI-FOB | 0.40 | TBAH | 0.178 |
| 99106 | 94 | 60:40 | 6 | TBPI-FOB | 0.80 | TBAH | 0.356 |
| 99107 | 94 | 60:40 | 6 | TBPI-FOB | 1.20 | TBAH | 0.534 |
| 99108 | 94 | 60:40 | 6 | TBPI-FOB | 1.60 | TBAH | 0.712 |
| 99109 | 94 | 60:40 | 6 | TBPI-FOB | 2.00 | TBAH | 0.889 |

TABLE 10

| Resist | $E_0$ (mJ/cm²) | UFTL (normalized) | Resolution (μm) | LER (qualitative) |
|---|---|---|---|---|
| 99105 | 0.17 | 0.8 | 200 | 6.8 |
| 99106 | 0.22 | 1.1 | 200 | 3.4 |
| 99107 | 0.36 | 1.0 | 200 | 4.6 |
| 99108 | 0.47 | 1.4 | 200 | 6.7 |
| 99109 | 1.22 | 1.8 | 200 | 13.6 |

The level of PAG, base, and t-butyl ester had an effect on resolution and LER. Resists 99105, 99106, 99107, 99108, and 99109 had sufficient sensitivity and acceptable UFTL to be employed as a 157 nm sensitive resist. All resists had similar resolution but the LER of Resists 99106 and 99107 is less than that of Resist 99105. This signifies that the high level of base in the resist was sufficient to insure a low LER. The LER of Resists 99106 and 99107 is also lower then Resists 99108 and 99109. This showed that low sensitivity does not insure low LER and that reducing the resist sensitivity by adding base does not insure low LER. This also shows that the effect of adding high levels of base is not unique to a set of photo-generated acids but can instead be generalized to different types of photo-generated acids.

Example 6

Preparation of Positive Acid Catalyzed Resists (Varying TBAH Base Additive Level)

A number of resists were prepared by adding polymer, PAG, and base in the amounts listed below in Table 11 to 1900 parts of ethyl lactate solvent to make an approximately 5.0% weight of solids to total weight solution. The solution was rolled over night and filtered through a 0.2 μm filter.

Table 12 provides the values of $E_{size}$, UFTL, resolution, and LER determined for the resists listed in Table 11. To determine $E_{size}$ and UFTL, the resists were spin cast to an approximately 125 nm film on a HMDS vapor primed silicon wafer followed by a PAB at 140° C. for 60 seconds. The resist was exposed to EUV (13.4) light at a series of different doses between 0 and 50 mJ/cm$^2$. After exposure, the wafer was PEB baked at 130° C. for 90 seconds. The wafer was then immersed in a surfactant containing 2.38% aqueous tetramethyl ammonium hydroxide solution for 45 seconds, removed and rinsed with DI water, and dried under a stream of nitrogen gas. For each resist, the $E_{size}$ and UFTL were then determined and are reported below.

To determine resolution and LER, each resist was spin cast to an approximately 125 nm film on a HMDS vapor primed silicon wafer followed by a PAB at 140° C. for 60 seconds. The resist was exposed to EUV (13.4) light through a reflective mask at a series of different doses and focuses. After exposure, the wafer was PEB baked at 130° C. for 90 seconds. The wafer was then immersed in a surfactant containing 2.38% aqueous tetramethyl ammonium hydroxide solution for 45 seconds, removed and rinsed with DI water, and dried under a stream of nitrogen gas. The resolution and LER were then determined and are reported below.

TABLE 11

| Resist | Amount | Polymer | Amount | PAG | Amount | Base | Ratio B/P |
|---|---|---|---|---|---|---|---|
| 99125 | 94 | 60:40 | 6 | TBPI-CS | 0.40 | TBAH | 0.160 |
| 99133 | 94 | 60:40 | 6 | TBPI-CS | 1.20 | TBAH | 0.481 |
| 99134 | 94 | 60:40 | 6 | TBPI-CS | 2.00 | TBAH | 0.802 |

TABLE 12

| Resist | $E_{size}$ (mJ/cm$^2$) | UFTL (nm) | Resolution (nm) | LER (nm) |
|---|---|---|---|---|
| 99125 | 5.4 | 9.4 | 80 | 13.6 |
| 99133 | 14.3 | 11.4 | 80 | 8.3 |
| 99134 | 34.1 | 13.0 | 80 | 8.3 |

The results demonstrate that the levels of base in a resist affect the LER of resists exposed to EUV light. Resists 99125, 99133, and 99134 all showed sufficient sensitivity and acceptable UFTL to be employed as EUV sensitive resists. Resist 99090 had higher LER compared to Resists 99133, and 99134. This can be attributed to the higher amount of base present in the resist formulation of both Resists 99133 and 99134. This shows that high base levels can decrease LER in resists imaged with EUV light and that the used of high based levels can be generalized to other wavelengths and is not specific to 157 nm lithography.

The LER values depend on both the resist and the exposure system and resists cannot be compared between different exposure systems but only ranked relative to each other on the same on a given exposure system. Resists 99125, 99133, and 99134 are identical in their coated film composition to Resists 99090, 99071, and 99099 respectively. The three resists have similar ranking in terms of the amount of LER but different absolute values of LER. The difference in absolute values can be attributed to differences in the aerial image of the two different exposures systems while the difference in relative values can be attributed to differences in the resist formulation, specifically the level of base.

Those of ordinary skill in the art will know, or be able to ascertain, using no more than routine experimentation, many equivalents to the specific embodiments of the invention described herein. These and all other equivalents are intended to be encompassed by the following claims. All publications and references cited herein, including those in the background section, are expressly incorporated herein by reference in their entirety.

What is claimed is:

1. A photoresist composition having a micron or submicron linewidth variation when exposed to radiation having a wavelength of about 248 nm or less, comprising a photoresist polymer, a photoacid generator and a base having a molar concentration ratio in a range of about 0.2 to less than 1 relative to the photoacid generator.

2. The photoresist of claim 1, wherein the photoresist polymer comprises a polyhydroxystyrene based polymer.

3. The photoresist of claim 1, wherein said polyhydroxystyrene based polymer is a copolymer or a terpolymer.

4. The photoresist of claim 3, wherein the copolymer or the terpolymer includes an acid labile protecting group.

5. The photoresist of claim 4, wherein said acid labile protecting group is any of a t-butyl ester, an acetal or a ketal.

6. The photoresist of claim 1, wherein the photoresist polymer comprises a polyacrylate based polymer.

7. The photoresist of claim 1, wherein the photoresist polymer comprises a polymethacrylate based polymer.

8. The photoresist of claim 1, wherein the photoresist polymer comprises at least one alcohol functional group attached to an aromatic moiety.

9. The photoresist of claim 1, wherein the photoresist polymer having at least one alcohol functional group comprises a copolymer.

10. The photoresist of claim 1, wherein the base is selected from the group consisting of tetramethylammonium hydroxide, tetrabutylammonium hydroxide, tetraethanol ammonium hydroxide, 1,4-diazabicylo[2.2.2]octane, 1,5-diazabicyclo[4.3.0]non-5-ene, diazabicyclo[5.4.0]undec-7-ene, triphenyl amine, diphenyl amine, trioctyl amine, triheptyl amine, hexamethylenetetramine, hexamethylenetriethylenetetramine, N-diethyl-N'methylenediamine, 4-aminophenol, and 2-(4-aminophenyl)-2-(4-hydroxyphenyl)propane.

11. The photoresist of claim 1, wherein photoacid generator is selected from the group consisting of di-t-butylphenyl iodonium camphor sulfonate, t-butylphenyl iodonium perfluorobenzo sulfonate, t-butylphenyl iodonium trifluoromethyl sulfonate, t-butylphenyl iodonium perfluorooctyl sulfonate, t-butylphenyl iodonium perfluorobutyl sulfonate, tri-t-butylphenyl sulfonium camphor sulfonate, N-camphorsulfonyloxybicyclo[2.2.1]hept-5-ene-2,3-dicarboximide and N-camphorsulfonyloxy-1,8-naphthalimide.

12. The photoresist of claim 1, wherein the molar concentration ratio of the base relative to the photoacid generator is in a range of about 0.4 to about 0.6.

13. The photoresist of claim 1, wherein the molar concentration ratio of the base relative to the photoacid generator is in a range of about 0.3 to about 0.8.

14. A method of generating a photolithographical pattern on a substrate, comprising:

applying a film of a photoresist composition to a substrate surface, said photoresist composition comprising a photoresist polymer, a photoacid generator and a base having a molar concentration ratio in a range of about 0.2 to less than 1 relative to the photoacid generator, and exposing said film to actinic radiation having a wavelength of about 248 or less to generate said pattern.

15. The method of claim 14, further comprising selecting the wavelength of said actinic radiation to be approximately 193 nm.

16. The method of claim 14, further comprising selecting the wavelength of said actinic radiation to be approximately 157 nm.

17. The method of claim 14, further comprising selecting the wavelength of said actinic radiation to be approximately 13.4 nm.

18. The method of claim 14, further comprising the step of transferring the pattern to lower layer of the film by utilizing a plasma etching process.

19. A method for reducing linewidth variations in a lithographical pattern generated by utilizing a photoresist adapted to be developed by actinic radiation at 248 nm or less, comprising the steps of:

providing a photoresist composition that includes a photoresist polymer, a photoacid generator and a base, a molar concentration ratio of the base relative to the photoacid generator being in a range of about 0.2 to less than 1, applying a film of said photoresist composition to a selected portion of a substrate, and exposing the film to actinic radiation having a wavelength of about 248 nm or less to generate a pattern having a line edge roughness (LER) less than about 10 nanometers.

20. The method of claim 19, further comprising selecting the ratio of the base relative to the photoacid generator to be in a range of about 0.3 to less than 0.8.

21. A method of generating sub-micron patterns having line edge roughness (LER) less than about 10 nanometers on a substrate, the method comprising the steps of:

applying a bilayer film to a selected portion of the substrate, an upper layer of the bilayer film including a photoresist polymer, a photoacid generator and a base having a molar concentration ratio in a range of about 0.2 to less than 1 relative to the photoacid generator, exposing said upper layer to actinic radiation to generated a selected pattern thereon, and transferring said selected pattern to a lower layer of the film by utilizing a plasma etching process.

* * * * *

UNITED STATES PATENT AND TRADEMARK OFFICE
CERTIFICATE OF CORRECTION

| | | |
|---|---|---|
| PATENT NO. | : 7,153,630 B2 | Page 1 of 1 |
| APPLICATION NO. | : 11/146597 | |
| DATED | : December 26, 2006 | |
| INVENTOR(S) | : Theodore H. Fedynyshyn | |

It is certified that error appears in the above-identified patent and that said Letters Patent is hereby corrected as shown below:

Please delete the paragraph encompassing Column 1, lines 10-12:

"The U.S. government has rights in this invention pursuant to a contract awarded by the Department of Defense, Contract No. F19628-00-0002."

and replace with:

--This invention was made with government support under Contract No. F19628-95-C-0002 awarded by the U.S. Air Force. The government has certain rights in this invention.--

Signed and Sealed this
Second Day of October, 2012

David J. Kappos
*Director of the United States Patent and Trademark Office*